United States Patent
Endo et al.

(10) Patent No.: US 9,735,179 B2
(45) Date of Patent: Aug. 15, 2017

(54) SEMICONDUCTOR CIRCUIT, METHOD FOR DRIVING THE SAME, STORAGE DEVICE, REGISTER CIRCUIT, DISPLAY DEVICE, AND ELECTRONIC DEVICE

(71) Applicant: Semiconductor Energy Laboratory Co., Ltd., Atsugi-shi, Kanagawa-ken (JP)

(72) Inventors: Masami Endo, Isehara (JP); Kazuaki Ohshima, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 16 days.

(21) Appl. No.: 14/632,282

(22) Filed: Feb. 26, 2015

(65) Prior Publication Data
US 2015/0171117 A1    Jun. 18, 2015

Related U.S. Application Data

(62) Division of application No. 13/310,824, filed on Dec. 5, 2011, now Pat. No. 9,024,317.

(30) Foreign Application Priority Data

Dec. 24, 2010   (JP) ................. 2010-287598

(51) Int. Cl.
*H01L 27/12* (2006.01)
*H01L 29/786* (2006.01)
(Continued)

(52) U.S. Cl.
CPC ....... *H01L 27/1225* (2013.01); *G09G 3/3648* (2013.01); *H01L 27/1255* (2013.01);
(Continued)

(58) Field of Classification Search
CPC . H01L 27/1225; H01L 29/7869; H01L 28/40; H01L 27/12; H01L 49/02
(Continued)

(56) References Cited

U.S. PATENT DOCUMENTS 5,731,856 A    3/1998  Kim et al.
5,744,864 A    4/1998  Cillessen et al.
(Continued)

FOREIGN PATENT DOCUMENTS

EP    1737044 A    12/2006
EP    2120267 A    11/2009
(Continued)

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
(Continued)

*Primary Examiner* — Asok K Sarkar
*Assistant Examiner* — Dmitriy Yemelyanov
(74) *Attorney, Agent, or Firm* — Robinson Intellectual Property Law Office; Eric J. Robinson

(57) ABSTRACT

A semiconductor circuit capable of controlling and holding the threshold voltage of a transistor at an optimal level and a driving method thereof are disclosed. A storage device, a display device, or an electronic device including the semiconductor circuit is also provided. The semiconductor circuit comprises a diode and a first capacitor provided in a node to which a transistor to be controlled is connected through its back gate. This structure allows the application of desired voltage to the back gate so that the threshold voltage of the transistor is controlled at an optimal level and can be held for a long time. A second capacitor connected in
(Continued)

parallel with the diode is optionally provided so that the voltage of the node can be changed temporarily.

15 Claims, 8 Drawing Sheets

(51) Int. Cl.
  *G09G 3/36* (2006.01)
  *H01L 49/02* (2006.01)
(52) U.S. Cl.
  CPC .......... *H01L 28/40* (2013.01); *H01L 29/7869* (2013.01); *G09G 2300/043* (2013.01); *G09G 2300/0819* (2013.01); *G09G 2320/0214* (2013.01)
(58) Field of Classification Search
  USPC .................................................. 257/43, 296
  See application file for complete search history.

(56) References Cited

U.S. PATENT DOCUMENTS

| | | |
|---|---|---|
| 5,900,665 A | 5/1999 | Tobita |
| 6,097,257 A | 8/2000 | Kadowaki et al. |
| 6,294,274 B1 | 9/2001 | Kawazoe et al. |
| 6,466,077 B1 | 10/2002 | Miyazaki et al. |
| 6,563,174 B2 | 5/2003 | Kawasaki et al. |
| 6,727,522 B1 | 4/2004 | Kawasaki et al. |
| 6,778,002 B2 | 8/2004 | Miyazaki et al. |
| 6,867,637 B2 | 3/2005 | Miyazaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,317,205 B2 | 1/2008 | Yamazaki et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,679,585 B2 | 3/2010 | Kimura |
| 7,714,633 B2 | 5/2010 | Kato |
| 7,732,819 B2 | 6/2010 | Akimoto et al. |
| 7,940,085 B2 | 5/2011 | Kim et al. |
| 7,994,500 B2 | 8/2011 | Kim et al. |
| 8,054,121 B2 | 11/2011 | Kato |
| 8,058,645 B2 | 11/2011 | Jeong et al. |
| 8,148,779 B2 | 4/2012 | Jeong et al. |
| 8,188,480 B2 | 5/2012 | Itai |
| 8,202,365 B2 | 6/2012 | Umeda et al. |
| 8,203,143 B2 | 6/2012 | Imai |
| 8,300,031 B2 | 10/2012 | Kimura |
| 8,384,076 B2 | 2/2013 | Park et al. |
| 8,530,246 B2 | 9/2013 | Ofuji et al. |
| 8,902,144 B2 | 12/2014 | Umezaki |
| 8,902,374 B2 | 12/2014 | Umezaki |
| 8,981,443 B2 | 3/2015 | Kimura |
| 9,012,918 B2 | 4/2015 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0075733 A1 | 4/2003 | Yamazaki et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199879 A1 | 9/2005 | Hoffman et al. |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0118869 A1 | 6/2006 | Lan et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0001205 A1 | 1/2007 | Kimura |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0297320 A1* | 12/2008 | Kawae ............... G06K 19/0701 340/10.1 |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0153225 A1* | 6/2009 | Nakahara ............. H03K 17/063 327/419 |
| 2009/0278122 A1 | 11/2009 | Hosono et al. |
| 2009/0280600 A1 | 11/2009 | Hosono et al. |
| 2009/0283763 A1 | 11/2009 | Park et al. |
| 2010/0065844 A1 | 3/2010 | Tokunaga |
| 2010/0092800 A1 | 4/2010 | Itagaki et al. |
| 2010/0102313 A1 | 4/2010 | Miyairi et al. |
| 2010/0109002 A1 | 5/2010 | Itagaki et al. |
| 2010/0148171 A1* | 6/2010 | Hayashi ............. H01L 21/28282 257/43 |

(56) References Cited

U.S. PATENT DOCUMENTS

| | | | |
|---|---|---|---|
| 2010/0279474 A1* | 11/2010 | Akimoto | H01L 29/7869 438/158 |
| 2010/0289832 A1 | 11/2010 | Yamamoto et al. | |
| 2010/0320458 A1 | 12/2010 | Umeda et al. | |
| 2010/0320459 A1 | 12/2010 | Umeda et al. | |
| 2011/0012117 A1 | 1/2011 | Yamazaki et al. | |
| 2011/0079784 A1 | 4/2011 | Im | |
| 2011/0102409 A1 | 5/2011 | Hayakawa | |
| 2011/0134680 A1 | 6/2011 | Saito | |
| 2011/0156025 A1 | 6/2011 | Shionoiri et al. | |
| 2011/0175647 A1 | 7/2011 | Kim et al. | |
| 2011/0175674 A1 | 7/2011 | Shimizu et al. | |
| 2011/0193083 A1 | 8/2011 | Kim et al. | |
| 2011/0199351 A1 | 8/2011 | Kurokawa | |
| 2011/0215328 A1 | 9/2011 | Morosawa et al. | |
| 2012/0051118 A1 | 3/2012 | Yamazaki et al. | |
| 2012/0112191 A1 | 5/2012 | Kato et al. | |
| 2012/0119205 A1 | 5/2012 | Taniguchi et al. | |
| 2015/0076576 A1 | 3/2015 | Umezaki | |
| 2015/0187812 A1 | 7/2015 | Kimura | |
| 2015/0214379 A1 | 7/2015 | Yamazaki et al. | |

FOREIGN PATENT DOCUMENTS

| | | |
|---|---|---|
| EP | 2226847 A | 9/2010 |
| EP | 2408011 A | 1/2012 |
| EP | 2927965 A | 10/2015 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-167073 A | 7/1993 |
| JP | 05-251705 A | 9/1993 |
| JP | 06-021478 A | 1/1994 |
| JP | 08-264794 A | 10/1996 |
| JP | 10-275466 A | 10/1998 |
| JP | 11-505377 | 5/1999 |
| JP | 2000-044236 A | 2/2000 |
| JP | 2000-150900 A | 5/2000 |
| JP | 2000-207893 A | 7/2000 |
| JP | 2001-053164 A | 2/2001 |
| JP | 2001-202036 A | 7/2001 |
| JP | 2001-229671 A | 8/2001 |
| JP | 2002-076356 A | 3/2002 |
| JP | 2002-289859 A | 10/2002 |
| JP | 2002-368226 A | 12/2002 |
| JP | 2003-086000 A | 3/2003 |
| JP | 2003-086808 A | 3/2003 |
| JP | 2003-186421 A | 7/2003 |
| JP | 2004-103957 A | 4/2004 |
| JP | 2004-273614 A | 9/2004 |
| JP | 2004-273732 A | 9/2004 |
| JP | 2005-322899 A | 11/2005 |
| JP | 2006-323376 A | 11/2006 |
| JP | 2007-041571 A | 2/2007 |
| JP | 2007-060722 A | 3/2007 |
| JP | 2009-231613 A | 10/2009 |
| JP | 2009-277702 A | 11/2009 |
| JP | 2009-278115 A | 11/2009 |
| JP | 2010-016347 A | 1/2010 |
| JP | 4415062 | 2/2010 |
| JP | 2010-067954 A | 3/2010 |
| JP | 2010-177431 A | 8/2010 |
| JP | 4571221 | 10/2010 |
| JP | 2010-251735 A | 11/2010 |
| JP | 2010-266490 A | 11/2010 |
| JP | 2012-160679 A | 8/2012 |
| TW | 201037682 | 10/2010 |
| WO | WO-2004/114391 | 12/2004 |
| WO | WO-2008/133345 | 11/2008 |
| WO | WO-2009/139482 | 11/2009 |
| WO | WO-2010/061723 | 6/2010 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A. (Physical Review. A), May 1, 1984, vol. 29, No. 5, pp. 2957-2959.

Kimizuka.N et al., "Spinel,YbFe2O4, and Yb2Fe3O7 Types of Structures for Compounds in the In2O3 and SC2O3—A2O3—BO Systems [A; Fe, Ga, or Al; B: Mg, Mn, Fe, Ni, Cu,or Zn] at Temperatures over 1000° C.", Journal of Solid State Chemistry, 1986, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MoO3 As a Charge-Generation Layer", Adv. Mater. (Advanced Materials), 2006, vol. 18, No. 3, pp. 339-342.

Lee.H et al., "Current Status of, Challenges to, and Perspective View of AM-OLED ", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

(56) References Cited

OTHER PUBLICATIONS

Park.S et al., "Challenge to Future Displays: Transparent AM-OLED Driven by PEALD Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "SUFTLA Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Supressed Voltage Loss for White Tandem OLEDs", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Godo.H et al., "P-9:Numerical Analysis on Temperature Dependence of Charateristics of Amorphous In—Ga—Zn-Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J at al., "High performance amorphous oxide thin film transistors with self-aligned top-gate structure", IEDM '09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m <4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters) , 2005, vol. 87, pp. 122102-1-122102-3.

Clark.S et al., "First Principles Methods Using Castep", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

(56) References Cited

OTHER PUBLICATIONS

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced At Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Kamiya.T et al., "Carrier transport properties and electronic structures of amorphous oxide semiconductors: the present status", Solid State Physics, Sep. 1, 2009, vol. 44, No. 9, pp. 621-633, Agne Gijutsu Center.

Nakayama et al., "17a-TL-8 Effect of GaO Layer on IGZO-TFT Channel", Extended Abstracts (The 57th Spring Meeting 2010), The Japan Society of Applied Physics and Related Societies, Mar. 17, 2010, pp. 21-008.

Taiwanese Office Action (Application No. 100147393) Dated Nov. 3, 2015.

\* cited by examiner

SEMICONDUCTOR CIRCUIT, METHOD FOR DRIVING THE SAME, STORAGE DEVICE, REGISTER CIRCUIT, DISPLAY DEVICE, AND ELECTRONIC DEVICE

BACKGROUND OF THE INVENTION

1. Field of the Invention

The present invention relates to semiconductor circuits and methods for driving the semiconductor circuits. The present invention relates to storage devices, display devices, and electronic devices.

2. Description of the Related Art

A field-effect transistor (FET) (hereinafter also referred to as a transistor) has three electrodes: a source, a gate, and a drain, and controls the flow of electrons or holes between the source and the drain by application of voltage to the gate. As a semiconductor used for an active layer, a Group IV element such as silicon or germanium, a Group III-V compound such as gallium arsenide, indium phosphide, or gallium nitride, a Group II-VI compound such as zinc sulfide or cadmium telluride, or the like can be used.

In recent years, FETs including an oxide such as zinc oxide or an indium gallium zinc oxide-based compound as a semiconductor have been reported (References 1 and 2). An FET including such an oxide semiconductor has comparatively high mobility and such a material has a wide bandgap of 3 eV or more; thus, application of a transistor including an oxide semiconductor to a display, a power device, or the like is discussed.

Transistors are roughly classified into two groups: enhancement transistors (normally off transistors) and depletion transistors (normally on transistors) according to their threshold voltages. In general, an enhancement transistor is off when a potential difference between a gate and a source is 0 V, whereas a depletion transistor is on when a potential difference between a gate and a source is 0 V.

REFERENCE

Reference 1: United States Patent Application Publication No. 2005/0199879

Reference 2: United States Patent Application Publication No. 2007/0194379

SUMMARY OF THE INVENTION

The threshold voltage of a transistor easily fluctuates depending on steps of manufacturing the transistor, and it is difficult to control the threshold voltage of the transistor properly. Further, the threshold voltage of the transistor might be changed because of degradation depending on circuit operation, a usage environment, or the like. Thus, it is preferable to control and hold the threshold voltage of the transistor at a desired level.

Further, it is preferable to control the threshold voltage of one transistor in such a manner that the transistor is used as an enhancement transistor in a certain time and is used as a depletion transistor in another time.

For example, in the case where a transistor is used as a switching element, the transistor is used as an enhancement transistor in a non-operating period so that leakage current and power consumption are reduced. In contrast, the transistor is used as a depletion transistor in an operating period so that large current flows. Such proper use is very effective in reducing the power consumption of the transistor and improving power efficiency.

In particular, in a storage device or a display device such as electronic paper or a liquid crystal display device that includes a memory cell including a transistor and a storage capacitor, the hold time can be lengthened when the transistor is an enhancement transistor whose leakage current is markedly reduced.

For example, in the case where the transistor is used in an electrostatic discharge (ESD) protection circuit or the like, keeping the transistor as a depletion transistor is effective in efficiently releasing surge current.

As a method for controlling the threshold voltage of a transistor, a method for shifting the threshold voltage of a transistor by application of bias voltage to one of two gate electrodes facing each other with a channel provided therebetween is known. Here, one of the gate electrodes to which bias voltage is applied is referred to as a back gate in some cases.

However, by the method, it is impossible to hold the threshold voltage of the transistor at a desired level while voltage is not applied to the back gate. Further, since it is necessary to always input voltage to the back gate, the method has the problems of an increase in power consumption and complex circuit operation.

An object of the present invention is to provide a semiconductor circuit capable of holding the threshold voltage of a transistor at an optimal level. An object of the present invention is to provide a semiconductor circuit capable of controlling the threshold voltage of a transistor and a method for driving the semiconductor circuit. An object of the present invention is to provide a storage device, a display device, or an electronic device including the semiconductor circuit.

In order to achieve the object, the present invention focuses on a semiconductor circuit for inputting voltage to a back gate of a transistor. As the semiconductor circuit connected to the back gate, a semiconductor circuit which can apply desired voltage so that the level of the threshold voltage of the transistor is optimal and can keep the level of the voltage may be used. A semiconductor circuit capable of changing the voltage of the back gate temporarily may be used.

In other words, one embodiment of the present invention is a semiconductor circuit that includes a diode, a first capacitor, and a second capacitor. One electrode of the diode is connected to a back gate of a first transistor, and a signal is input to the other electrode of the diode. One electrode of the first capacitor is connected to the one electrode of the diode, and the other electrode of the first capacitor is grounded. The second capacitor is connected in parallel with the diode. The threshold voltage of the first transistor can be controlled by the semiconductor circuit.

One embodiment of the present invention is a method for driving a semiconductor circuit. The method includes a first step of: inputting a first input signal from an input portion through a diode, holding first voltage in a first capacitor, and setting the threshold voltage of a transistor to first threshold voltage by application of the first voltage to a back gate of the transistor, and a second step of inputting a second input signal through a second capacitor connected in parallel with the diode and setting the threshold voltage of the transistor to second threshold voltage by application of second voltage to the back gate of the transistor.

An output terminal of the semiconductor circuit of the present invention is connected to a back gate of a transistor to be controlled (the first transistor). In the semiconductor circuit, the diode and the first capacitor whose other electrode is grounded are connected to an output node of the back gate, and the second capacitor is connected in parallel with the diode. Although described in detail later, the direction of the diode is selected as appropriate in accordance with the polarity of the transistor or input voltage.

Voltage input from the other electrode of the diode is held in the first capacitor; thus, bias voltage output to the back gate of the transistor to be controlled (the voltage of the output node) is held even when input of the voltage is stopped. Thus, the threshold voltage of the transistor to be controlled that is connected to the semiconductor circuit is held at an appropriate level even when input of voltage is stopped.

In the case where reverse voltage is input to the input portion of the semiconductor circuit, the voltage of the output node is temporarily changed by capacitive coupling of the second capacitor connected in parallel with the diode. Thus, the threshold voltage of the transistor to be controlled that is connected to the output node can be temporarily changed.

In one embodiment of the present invention, the diode included in the semiconductor circuit is formed using a second transistor including an oxide semiconductor in a semiconductor layer in which a channel is formed.

As the diode included in the semiconductor circuit, a transistor including an oxide semiconductor in a semiconductor layer in which a channel is formed can be used. A transistor that is formed through appropriate manufacturing steps and includes an oxide semiconductor has extremely low off-state current; thus, the hold time of voltage held in the semiconductor circuit can be markedly lengthened.

In one embodiment of the present invention, the first transistor to which the semiconductor circuit is connected includes an oxide semiconductor in a semiconductor layer in which a channel is formed.

When the oxide semiconductor is included in a semiconductor layer of the transistor to be controlled in which a channel is formed and when the transistor is used in a storage device or a display device, the retention time of data or a display image can be markedly lengthened.

The semiconductor circuit in one embodiment of the present invention can be used in a variety of electronic devices in addition to a storage device including a register circuit and a display device.

By application of a semiconductor device of the present invention to a storage device such as a register circuit, it is possible to obtain a storage device in which data can be retained even when supply of power is interrupted, refresh (reset) operation can be performed, and power consumption is markedly reduced. By application of such a storage device to an arithmetic unit such as a CPU, an electronic device such as a personal computer or a cellular phone that includes the arithmetic unit can be an electronic device in which supply of power can be temporarily interrupted, power consumption is low, and restart operation is performed quickly.

By application of the semiconductor device of the present invention to a display device such as electronic paper or a liquid crystal display device, it is possible to obtain a display device in which a display image can be held even when supply of power is interrupted, refresh operation can be performed, and power consumption is markedly reduced.

According to the present invention, it is possible to provide a semiconductor circuit capable of holding the threshold voltage of a transistor at an optimal level. It is possible to provide a semiconductor circuit capable of controlling the threshold voltage of a transistor and a method for driving the semiconductor circuit. It is possible to provide a storage device, a display device, or an electronic device including the semiconductor circuit.

DETAILED DESCRIPTION OF THE INVENTION

Figure 1A:
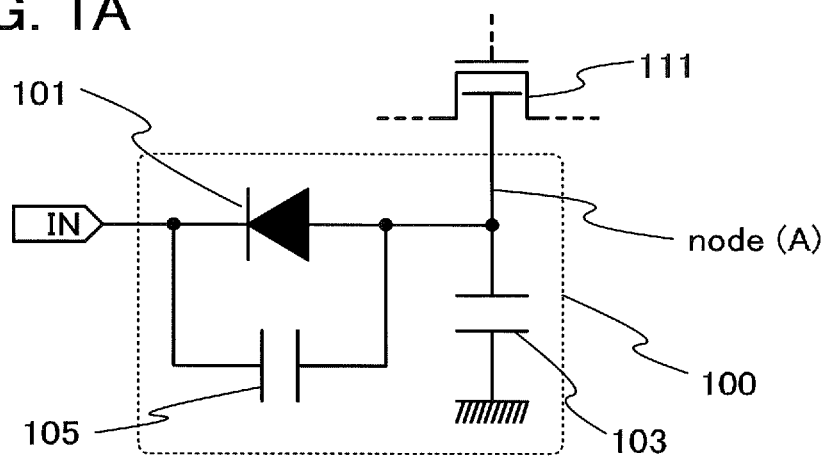
FIGS. 1A and 1B illustrate a semiconductor circuit in one embodiment of the present invention.

Embodiments will be described in detail with reference to the drawings. Note that the present invention is not limited to the following description. It will be readily appreciated by those skilled in the art that modes and details of the present invention can be modified in various ways without departing from the spirit and scope of the present invention. The present invention therefore should not be construed as being limited to the following description of the embodiments. Note that in structures of the present invention described below, the same portions or portions having similar functions are denoted by the same reference numerals in different drawings, and description thereof is not repeated.

Note that in each drawing described in this specification, the size, the layer thickness, or the region of each component is exaggerated for clarity in some cases. Thus, embodiments of the present invention are not limited to such scales.

A transistor is a kind of semiconductor elements and can perform amplification of current or voltage, switching operation for controlling conduction or non-conduction, or the like. A transistor in this specification includes an insulated-gate field-effect transistor (IGFET) and a thin film transistor (TFT).

Functions of a "source" and a "drain" might interchange when a transistor of opposite polarity is used or the direction of current flow is changed in circuit operation, for example. Thus, in this specification, the terms "source" and "drain" can interchange.

In this specification and the like, one of a source and a drain of a transistor is referred to as a "first electrode" and the other of the source and the drain is referred to as a "second electrode" in some cases. Note that in that case, a gate is also referred to as a "gate" or a "gate electrode".

In this specification and the like, in the case where a transistor has two gate electrodes facing each other with a semiconductor layer provided therebetween, these gate electrodes are referred to as a "first gate electrode" and a "second gate electrode", and one of the electrodes is referred to as a "back gate" in some cases.

In this specification and the like, of two electrodes of a diode, the electrode on the input side (the anode side) with respect to the direction of current flow is referred to as a "first electrode", and the electrode on the output side (the cathode side) is referred to as a "second electrode".

In this specification and the like, one of two electrodes of a capacitor is referred to as a "first electrode" and the other of the two electrodes of the capacitor is referred to as a "second electrode". In the case where description is made with reference to a circuit diagram or the like, of two electrodes, the electrode positioned on the upper side or left side of the diagram is referred to as a first electrode and the electrode positioned on the lower side or right side of the diagram is referred to as a second electrode for clarity.

In this specification and the like, the term "electrically connected" includes the case where components are connected to each other through an object having any electric action. Here, there is no particular limitation on an object having any electric action as long as electric signals can be transmitted and received between components that are connected to each other through the object. Examples of an "object having any electric action" include a switching element such as a transistor, a resistor, an inductor, a capacitor, and an element with a variety of functions in addition to an electrode and a wiring.

Note that in this specification and the like, a node is an element (e.g., a wiring) which enables electrical connection between elements included in a circuit. Thus, a "node to which A is connected" is a wiring which is electrically connected to A and can be regarded as having the same potential as A. Note that even when one or more elements which enable electrical connection (e.g., switches, transistors, capacitors, inductors, resistors, or diodes) are inserted in a portion of the wiring, the wiring can be regarded as the "node to which A is connected" as long as it has the same potential as A.

In this specification and the like, in the case where a circuit includes a plurality of elements or a plurality of structural units including a plurality of elements and they have common functions, (n) might be added to their reference numerals in order to describe structures, functions, and the like that are common to the elements or the structural units. Further, (1 to n) might be added to the reference numerals in order to represent some or all of the elements or the structural units having common functions.

Embodiment 1

In this embodiment, examples of a semiconductor circuit capable of controlling the threshold voltage of a transistor in the present invention are described with reference to FIGS. 1A and 1B, FIGS. 2A and 2B, and FIGS. 3A and 3B.
<Structure Example>

FIG. 1A illustrates a control circuit 100 in this embodiment and a transistor 111 connected to the control circuit 100.

The transistor 111 includes a back gate (a second gate electrode), and output voltage from the control circuit 100 is input to the back gate. Although an n-channel transistor is used as the transistor 111 in this embodiment, a p-channel transistor can be used.

The control circuit 100 includes a diode 101, a capacitor 103, and a capacitor 105. An input terminal IN is connected to the control circuit 100. A second electrode of the diode 101 is connected to an input portion, and a first electrode of the diode 101 is connected to a first electrode of the capacitor 103. A second electrode of the capacitor 103 is grounded. The capacitor 105 is connected in parallel with the diode 101. Here, a node to which the first electrode of the diode 101, the first electrode of the capacitor 103, and a second electrode of the capacitor 105 are connected corresponds to an output portion of the control circuit 100 and hereinafter is referred to as a node (A).
<Example of Circuit Operation>

Next, a method for controlling the threshold voltage of the transistor 111 with the use of the control circuit 100 is described with reference to FIGS. 1A and 1B and FIGS. 2A and 2B. FIGS. 2A and 2B schematically show source-drain current Ids with respect to gate-source voltage Vgs of the transistor 111 in FIG. 1A at the time of application of source-drain voltage Vds.

A curve 151 in FIG. 2A represents the Vgs-Ids characteristics of the transistor 111 in an initial state. In this embodiment, the threshold voltage Vth (0) of the transistor in the initial state is 0 V.

First, a first input signal with amplitude voltage that is lower than 0 V (negative amplitude voltage) is input from the input terminal IN of the control circuit 100. With the first input signal, current flows from the first electrode of the diode 101 to the second electrode of the diode 101. Thus, the voltage of the node (A) is decreased and is held in the capacitor 103.

Then, input of the first input signal is stopped (the voltage of the first input signal is set to 0 V). Here, since the voltage of the node (A) is lower than 0 V, reverse bias is applied to the diode 101. Thus, only low leakage current flows and the voltage of the node (A) is held in the capacitor 103.

Consequently, the negative voltage held in the node (A) is continuously applied to the back gate of the transistor 111 that is connected to the output portion of the control circuit 100. As a result, in the Vgs-Ids characteristics of the transistor 111, Vgs is shifted positively as shown by a curve 152 in FIG. 2A. The threshold voltage of the transistor 111 in that state is referred to as Vth (1).

By appropriate adjustment of the amplitude voltage of the first input signal, the transistor 111 can be an enhancement transistor that has characteristics shown by the curve 152.

As described above, the voltage of the node (A) is held in the capacitor 103, and electrical charge held in the capacitor 103 is decreased only by extremely low leakage current of the diode 101; thus, the threshold voltage of the transistor 111 can be held at an optimal level even after input of the input signal is stopped.

Next, a method for temporarily changing the transistor 111 that becomes the enhancement transistor as described above into a depletion transistor, i.e., a method for temporarily shifting the threshold voltage negatively is described.

A second input signal with amplitude voltage that is higher than 0 V (positive amplitude voltage) and a positive voltage gradient is input from the input terminal IN. After the second input signal is input, capacitive coupling is caused by the capacitor 105 and the voltage of the node (A) is temporarily increased.

Consequently, positive voltage is temporarily applied to the back gate of the transistor 111, so that in the Vgs-Ids characteristics of the transistor 111, Vgs is temporarily shifted negatively as shown by a curve 153 in FIG. 2B. The threshold voltage of the transistor 111 in that state is referred to as Vth (2).

By appropriate adjustment of the amplitude voltage and the positive voltage gradient of the second input signal, the transistor 111 can be a depletion transistor that has characteristics shown by the curve 153.

Here, as described above, in order to raise the voltage of the node (A) temporarily, capacitive coupling caused by the capacitor 105 is employed. Thus, the degree of a change in voltage of the node (A) is proportional to the capacitance of the capacitor 105 and the voltage gradient of the waveform of the second input signal. Consequently, the waveform of the second input signal may be set as appropriate so that the threshold voltage of the transistor 111 is shifted to a desired level. In order to shift the threshold voltage of the transistor 111 quickly, the waveform of the second input signal preferably has a positive voltage gradient which is as steep as possible. Further, a waveform with a gradient, such as a rectangular wave, a triangular wave, or a sine wave, can be used as the waveform of the second input signal.

Figure 1B:
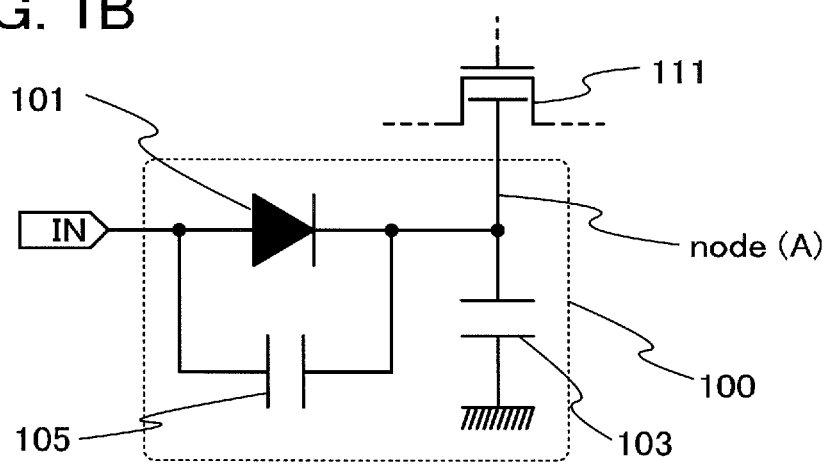
Figure 2A:
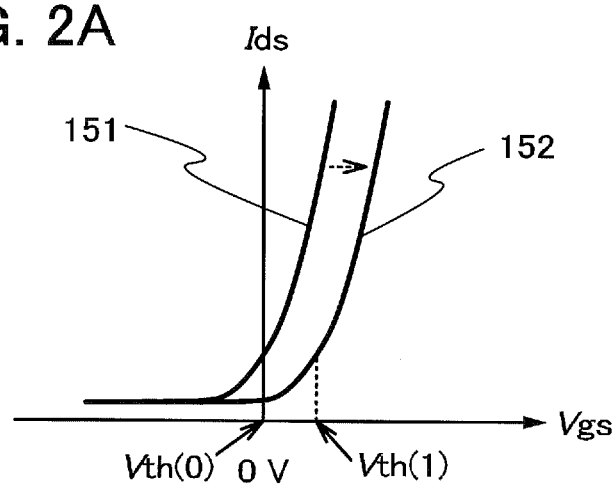
FIGS. 2A and 2B show transistor characteristics at the time when the semiconductor circuit in one embodiment of the present invention is used.
Figure 2B:
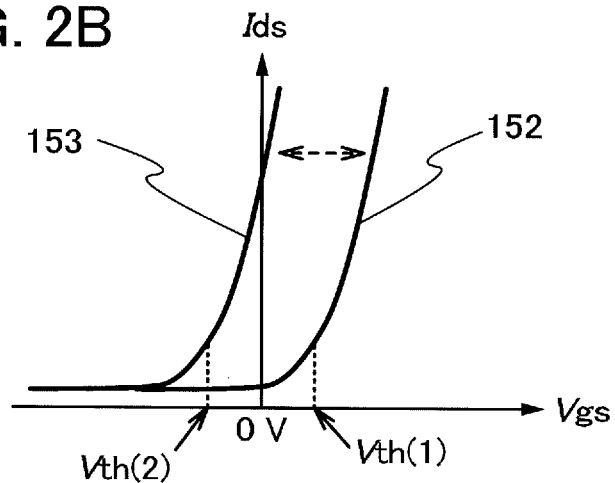

Note that a structure and a method in which Vth of the transistor 111 that is shifted positively with the first input signal is held and Vth is temporarily shifted negatively with the second input signal are described above; however, when the positions of the first electrode and the second electrode of the diode 101 are reversed as illustrated in FIG. 1B, the direction of a shift in Vth can be reversed. In that case, the first control signal has positive amplitude voltage, and the second control signal has negative amplitude voltage and a negative voltage gradient.

Although an n-channel transistor is used as the transistor to be controlled in this embodiment, this embodiment is not limited thereto. A p-channel transistor can be used. For example, in the case where a p-channel transistor is used as the transistor 111 in FIG. 1A, the transistor 111 can be a p-channel depletion transistor by a positive shift in the threshold voltage with the first input signal and can be a p-channel enhancement transistor by a temporary negative shift in the threshold voltage with the second control signal. In order to obtain opposite characteristics, the connection of the diode may be reversed as in FIG. 1B and the above method may be used.

<Modification Example>

Figure 3A:
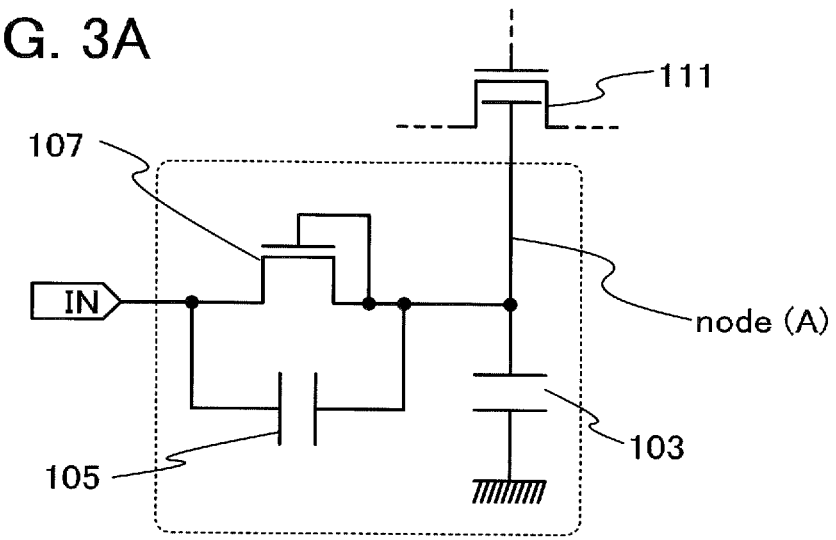
FIGS. 3A and 3B illustrate semiconductor circuits in one embodiment of the present invention.
Figure 3B:
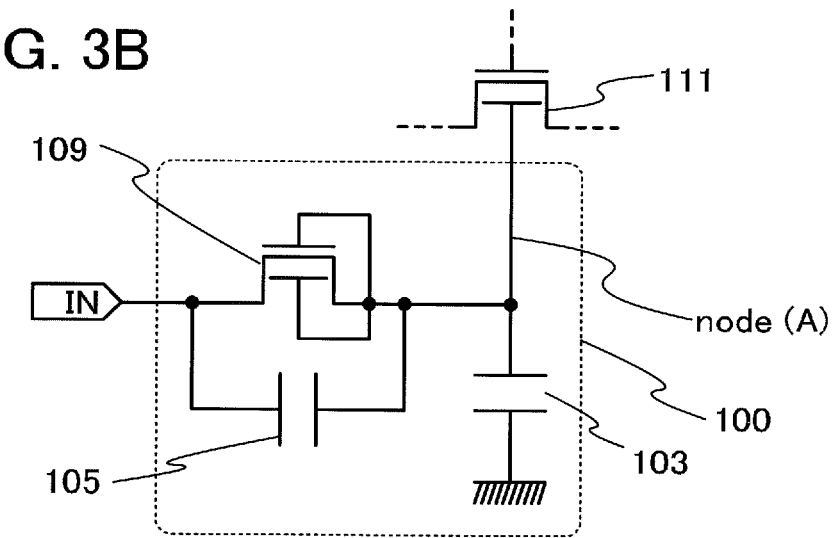

Here, the diode 101 included in the control circuit 100 can be formed using a transistor. FIGS. 3A and 3B each illustrate an example in which a transistor is used as the diode included in the control circuit.

For example, in the control circuit 100 in FIG. 3A, a transistor 107 whose first electrode is connected to the input terminal IN and whose second electrode and gate electrode are connected to the node (A) can be used as a diode, as illustrated in FIG. 3A. Alternatively, as illustrated in FIG. 3B, a transistor 109 including a back gate may be used and two gate electrodes of the transistor 109 may be connected to the node (A). By connection of the back gate in addition to the gate electrode with the node (A), the current value at the time of application of forward bias can be increased, and the time for input of the first input signal can be shortened. Further, leakage current at the time of application of reverse bias can be suppressed, so that the hold time of the voltage of the node (A) can be lengthened.

Note that in order to make the diode have opposite characteristics, the gate electrode (and the back gate) may be connected to a node on the input terminal IN side.

As the diode included in the control circuit, a transistor including an oxide semiconductor in a semiconductor layer in which a channel is formed can be used. As described in later embodiments, a transistor that is formed through appropriate manufacturing steps and includes an oxide semiconductor has extremely low off-state current; thus, the hold time of voltage held in the control circuit can be markedly lengthened.

In particular, in the case of an oxide semiconductor with a bandgap of 3 eV or more, by making the concentration of donors or acceptors $1\times10^{12}$ cm$^{-3}$ or lower, off-state resistance can be extremely high. For example, by optimizing the gate voltage of such a transistor, resistance between a source and a drain can be $1\times10^{24}\Omega$ or higher. Thus, even in the case of a diode-connected transistor, for example, leakage current in an off state can be markedly reduced as compared to a transistor whose semiconductor layer includes silicon.

When such a transistor is used as the diode included in the control circuit, leakage current from the diode at the time when voltage is held in the node (A) can be extremely low. Thus, the threshold voltage of the transistor to be controlled can be held for an extremely long time. Further, since the leakage current is extremely low, the size of the capacitor for holding the voltage of the node (A) can be decreased. Consequently, spillover effects such as a reduction in circuit area and a reduction in charging and discharging time are achieved.

With the use of the control circuit in this embodiment, the threshold voltage of a transistor can be controlled at an optimal level, and the threshold voltage of the transistor can be held even when supply of power supply voltage is stopped. Further, by a temporal shift in the threshold voltage, different transistor characteristics can be obtained.

This embodiment can be combined with any of the other embodiments disclosed in this specification as appropriate.

Embodiment 2

In this embodiment, a structure example where the semiconductor circuit capable of controlling the threshold voltage of a transistor in Embodiment 1 is used as a register circuit that is one of storage devices is described with reference to FIGS. 4A and 4B.

<Structure Example>

Figure 4A:
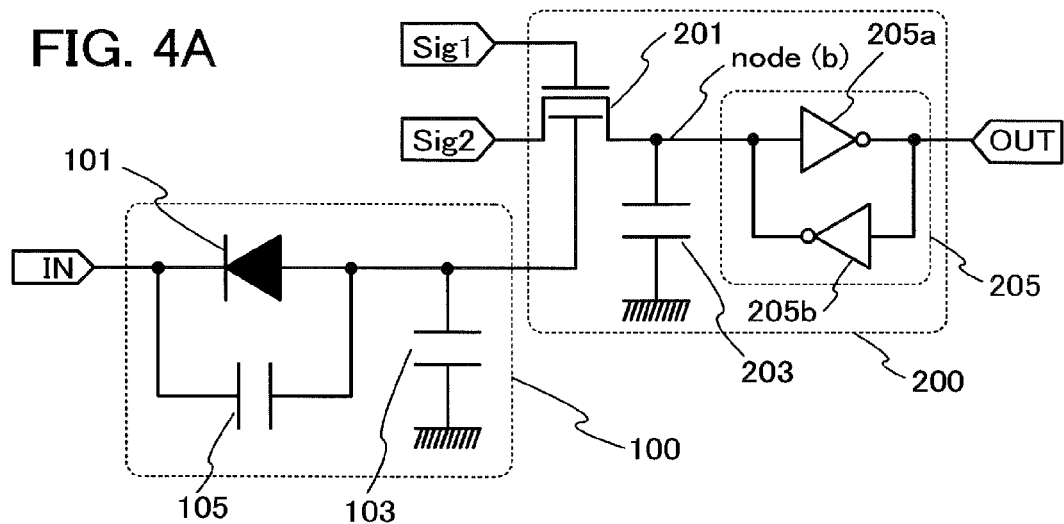
FIGS. 4A and 4B illustrate a register circuit in one embodiment of the present invention.

FIG. 4A illustrates a structure example of a 1-bit register circuit to which the control circuit 100 in Embodiment 1 is connected. A register circuit 200 includes a transistor 201, a capacitor 203, and a flip-flop circuit 205. In this embodiment, an n-channel transistor is used as the transistor 201.

The transistor 201 includes a back gate (a second gate electrode) as in the transistor 111 in Embodiment 1, and output voltage from the control circuit 100 is input to the back gate. An input terminal Sig1 is connected to a first gate electrode of the transistor 201, an input terminal Sig2 is connected to a first electrode of the transistor 201, and the transistor 201 is controlled with input signals from the two input terminals. A second electrode of the transistor 201 is connected to a first electrode of the capacitor 203 and the flip-flop circuit 205. A second electrode of the capacitor 203 is grounded. Here, a node to which the second electrode of the transistor 201 and the first electrode of the capacitor 203 are connected is referred to as a node (b).

The flip-flop circuit 205 includes an inverter 205a and an inverter 205b. The inverter 205a whose direction is opposite to the direction of the inverter 205b is connected in parallel with the inverter 205b, and a node to which an output side of the inverter 205a is connected corresponds to an output terminal OUT of the register circuit 200.

The register circuit 200 stores and outputs data with input signals from the input terminals Sig1 and Sig2. For example, when high-level voltages are input from Sig1 and Sig2, the transistor 201 is turned on, so that high-level voltage is input to the node (b). Accordingly, low-level voltage obtained by inversion in the inverter 205a is output from the output terminal of the register circuit 200, and at the same time, data of the low-level voltage is stored in the flip-flop circuit 205. In contrast, when low-level voltage is input from Sig2, high-level voltage is output from the output terminal of the register circuit 200 similarly, and data of the high-level voltage is stored in the flip-flop circuit 205.

The capacitor 203 has a function of holding the voltage of the node (b). As described later, when the transistor 201 is kept as an enhancement transistor that has extremely low leakage current by the control circuit 100, by provision of the capacitor 203, voltage input to the node (b) can be held even when supply of power supply voltage is stopped.

Note that in this embodiment, a simple structure of two inverter circuits is described as an example of the flip-flop circuit included in the register circuit 200; however, this embodiment is not limited to this structure. A clocked inverter capable of performing clock operation or a structure in which a NAND circuit and an inverter are combined can be used as appropriate. For example, a known flip-flop circuit such as an RS flip-flop circuit, a JK flip-flop circuit, a D flip-flop circuit, or a T flip-flop circuit can be used as appropriate.

<Example of Circuit Operation>

Next, the circuit operation of the register circuit 200 to which the control circuit 100 is connected is described.

First, by the method in Embodiment 1, a first input signal with amplitude voltage that is lower than 0 V (negative amplitude voltage) is input from the input terminal IN of the control circuit 100, and the transistor 201 is controlled and kept as an enhancement transistor by a change in threshold voltage of the transistor 201.

Then, signals are input from the input terminals Sig1 and Sig2 of the register circuit 200, and data of the signals is stored and output. When voltage that is higher than the threshold voltage of the transistor 201 and a signal with high-level voltage or low-level voltage are input from Sig1 and Sig2, respectively, at the time of writing data to the register circuit, the data can be stored in the flip-flop circuit 205.

Further, by making the signal of Sig1 have voltage at which the transistor 201 is turned off (e.g., 0 V or voltage lower than 0 V) before input of the signal to Sig2 is stopped, voltage which is close to the voltage input is held in the capacitor 203 even after input of the signal from Sig2 is stopped.

Here, the transistor 201 is kept as the enhancement transistor whose leakage current is extremely low by the control circuit 100. Thus, a voltage drop in the node (b) due to leakage from the transistor 201 can be markedly reduced even when high-level voltage is held in the node (b).

Further, even in the case where supply of power to the control circuit 100 and the register circuit 200 is stopped, the voltage of the node (b) can be held because the transistor 201 is kept as the enhancement transistor whose leakage current is extremely low. By retaining voltage data in the node (b) while the supply of power is stopped, data which is the same as the data just before the supply of power is stopped is defined as data to be stored in the register circuit 200 at the same time as the restart of the supply of power to the register circuit 200. Thus, the data can be stored and output instantaneously.

Here, a transistor where an oxide semiconductor is used in a semiconductor layer in which a channel is formed and off-state current is extremely low as described in Embodiment 1 can be used as the transistor 201. With the use of such a transistor whose off-state current is extremely low as the transistor 201, the voltage of the node (b) can be held for an extremely long time. Thus, the register circuit 200 can be used as a so-called nonvolatile register circuit.

Next, operation to reset data stored in the register circuit 200 is described.

By inputting a second input signal with amplitude voltage that is higher than 0 V (positive amplitude voltage) from the input terminal of the control circuit 100 as in Embodiment 1, the threshold voltage of the transistor 201 is temporarily shifted negatively, so that the transistor 201 is temporarily set as a depletion transistor.

Voltage at which the enhancement transistor 201 is turned off is input to Sig1 before input of the second input signal. By the input of the second input signal, the transistor 201 is temporarily in an on state. Thus, the voltage of the node (b) can be temporarily close to voltage input from Sig2. For example, if high-level voltage is input to Sig2 at the time of the input of the second input signal, the high-level voltage is also input to the node (b). If low-level voltage is input to Sig2 at the time of the input of the second input signal, the low-level voltage is also input to the node (b). Consequently, the data is reset.

Then, when the input of the second input signal is stopped, the level of the threshold voltage of the transistor 201 is returned to the level which is the same as the level before the input of the second input signal; thus, the transistor 201 returns to enhancement transistor whose leakage current is extremely low. Consequently, the data which is reset and input by the second input signal is held again.

By such a method, data to be stored in the register circuit 200 can be reset without the use of an input signal from Sig1. This method is particularly effective in the case where data stored in a plurality of register circuits is reset by one operation in a storage device including the plurality of register circuits to be described later.

<Application>

Next, an example in which a control circuit of the present invention is applied to a storage device including the plurality of register circuits 200 is described.

Figure 4B:
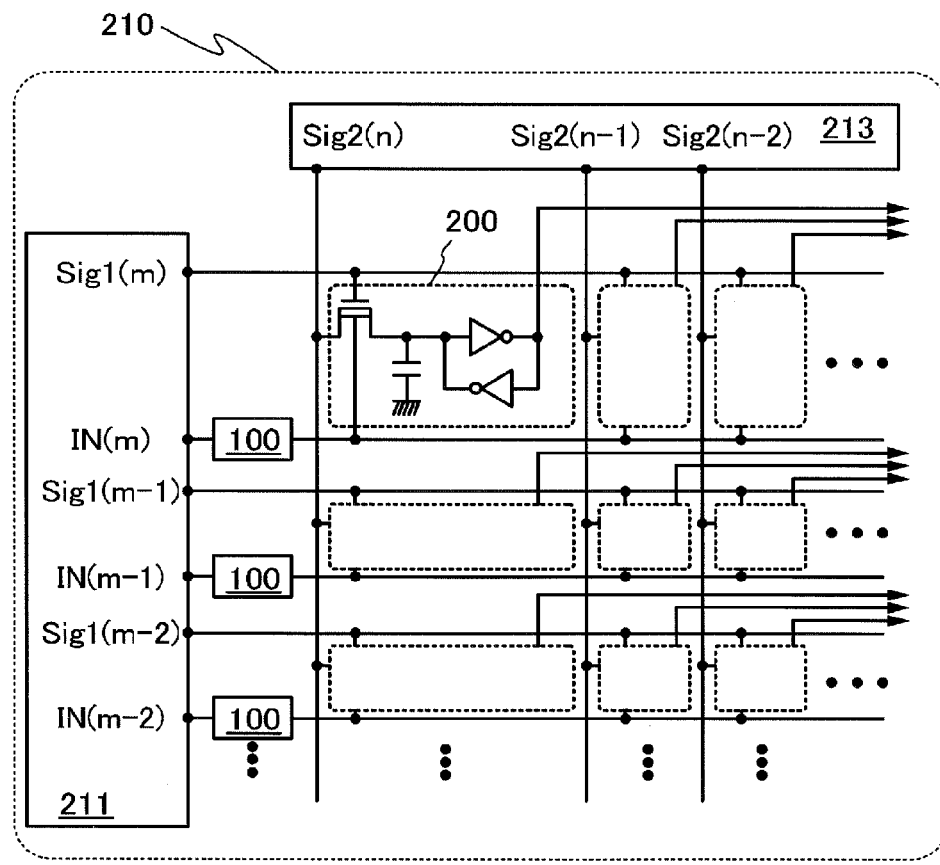

FIG. 4B illustrates a storage device 210 in which the plurality of register circuits 200 in FIG. 4A are arranged in matrix. The storage device 210 includes a first driver circuit 211, a second driver circuit 213, and the plurality of control circuits 100 in addition to the plurality of register circuits 200. In this embodiment, the plurality of register circuits 200 are arranged in a matrix of m rows and n columns (m and n are each an integer of 1 or more), and one control circuit 100 is provided per row (i.e., m control circuits are provided in total).

The first driver circuit 211 includes m control lines Sig1(1) to Sig1($m$) connected to the first gate electrodes of the transistors 201 in the register circuits 200. On and off of the transistors 201 in the register circuits arranged in rows are controlled by the control lines Sig1(1) to Sig1($m$). The first driver circuit 211 further includes m control lines IN(1) to IN(m) connected to the first to m-th control circuits, respectively. The m control lines IN(1) to IN(m) control signals input to the control circuits 100 connected to the m control lines IN(1) to IN(m).

The second driver circuit 213 includes n control lines Sig2(1) to Sig2($n$) connected to the first electrodes of the transistors 201 in the register circuits 200. A signal of data input to the register circuits 200 arranged in columns is controlled by the control lines Sig2(1) to Sig2($n$).

Output signal lines are connected to the register circuits 200, and output signals from the register circuits 200 are output to the output signal lines. In this embodiment, m×n output signal lines are used; however, one output signal line may be shared by the plurality of register circuits so that data is selectively read. Further, a circuit having any of a variety of functions, such as a conversion circuit for converting a signal into a serial signal or a several-bit parallel signal, may be provided at the end of the output signal line.

A first input signal and a second input signal which are similar to those in Embodiment 1 are input to the control circuits 100 provided per row from the first driver circuit 211 through the control lines IN(1) to IN(m). By the first input signal, the threshold voltages of the transistors 201 in the n register circuits connected to one of the control circuits 100 can be controlled and held at optimal levels. In addition, when the second control signal is input, the transistors 201 in the n register circuits are temporarily changed from enhancement transistors into depletion transistors, so that the data stored in the register circuits can be reset at the same time by one signal.

Note that in this embodiment, one control circuit is provided per row; however, this embodiment is not limited to this structure. One or more control circuits may be provided. For example, one control circuit may be provided to control the threshold voltages in all the register circuits 200; one control circuit may be provided for plural rows; or one control circuit 100 may be provided for each of the register circuits 200.

As described above, by application of a control circuit of the present invention, it is possible to obtain a storage device including a plurality of register circuits that can hold threshold voltage at an optimal level and can easily perform reset operation. Further, it is possible to obtain a so-called nonvolatile register circuit capable of retaining data even when supply of power is stopped, though it is a register circuit.

This embodiment can be combined with any of the other embodiments disclosed in this specification as appropriate.

Embodiment 3

In this embodiment, an example where the semiconductor circuit capable of controlling the threshold voltage of a transistor in Embodiment 1 is used as a storage device whose structure is different from the structure of the storage device in Embodiment 2 is described with reference to FIGS. 5A and 5B.

<Structure Example>

Figure 5A:
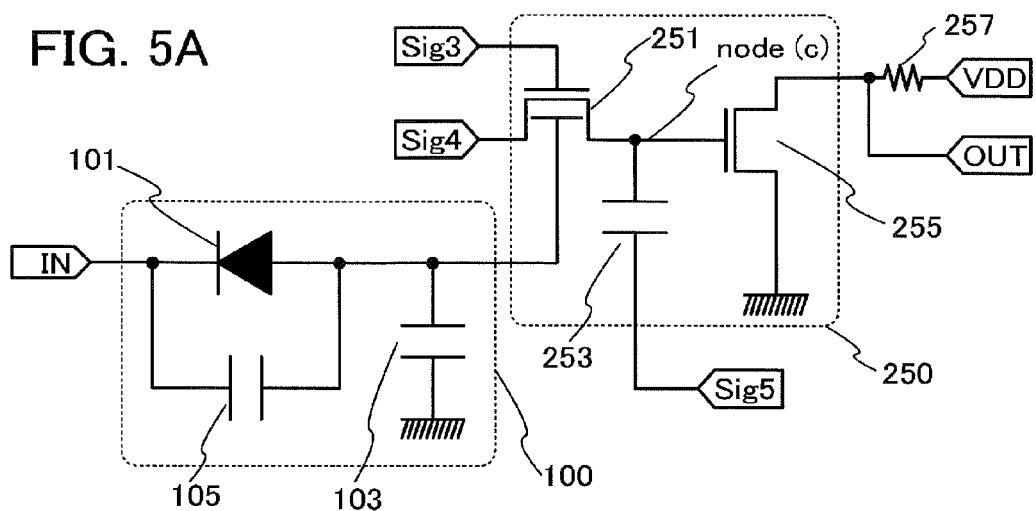
FIGS. 5A and 5B illustrate a memory circuit in one embodiment of the present invention.

FIG. 5A illustrates a structure example of a 1-bit memory cell 250 to which the control circuit 100 in Embodiment 1 is connected. The memory cell 250 includes a transistor 251, a capacitor 253, and a transistor 255. In this embodiment, an n-channel transistor is used as the transistor 251 as in the transistor 201 in Embodiment 2.

Output voltage from the control circuit 100 is input to a back gate of the transistor 251. An input terminal Sig3 is connected to a first gate electrode of the transistor 251, an input terminal Sig4 is connected to a first electrode of the transistor 251, and the transistor 251 is controlled with control signals from the two input terminals. A second electrode of the transistor 251 is connected to a first electrode of the capacitor 253 and a gate electrode of the transistor 255. An input terminal Sig5 is connected to a second electrode of the capacitor 253. A second electrode of the transistor 255 is grounded, and a node to which a first electrode of the transistor 255 is connected corresponds to an output portion of data from the memory cell. Here, a node to which the second electrode of the transistor 251 and the first electrode of the capacitor 253 are connected is referred to as a node (c).

The capacitor 253 has a function of holding voltage input to the node (c) as in the capacitor 203 in Embodiment 2. The voltage of the node (c) can be changed by voltage input from the input terminal Sig5.

The transistor 255 is provided to read data (voltage) retained in the memory cell. A power input terminal VDD is connected to the first electrode of the transistor 255 through a resistor 257, and the output terminal OUT is connected between the resistor 257 and the first electrode of the transistor 255. Here, in this embodiment, an n-channel transistor is used as the transistor 255. For example, when the node (c) has high-level voltage, the transistor 255 is turned on, and ground voltage is output to the output terminal OUT. In contrast, when the node (c) has low-level voltage, the transistor 255 is turned off so that it has much higher resistance than the resistor 257, and power supply voltage input to a power supply terminal is output to the output terminal OUT. In this manner, the level of the voltage of the node (c) can be read.

Although an n-channel transistor is used as the transistor 255 in this embodiment, a p-channel transistor can be used. In that case, when the power input terminal VDD is connected to the second electrode of the transistor 255 and a second electrode of the resistor 257 is grounded, read operation can be performed.

<Example of Circuit Operation>

Next, the circuit operation of the memory cell 250 to which the control circuit 100 is connected is described.

First, as described in Embodiments 1 and 2, a first input signal is input to the control circuit 100 so that the threshold voltage of the transistor 251 is adjusted to an optimal level, and the transistor 251 is controlled so as to function as an enhancement transistor.

As in Embodiment 2, data is written to the memory cell 250 by input of voltage to be held in the node (c) with input signals from the input terminal Sig3 and the input terminal Sig4. Here, high-level voltage or low-level voltage is held in the node (c).

Here, as in Embodiment 2, a transistor where an oxide semiconductor is used in a semiconductor layer in which a channel is formed and off-state current is extremely low as described in Embodiment 1 can be used as the transistor 251. With the use of such a transistor whose off-state current is extremely low as the transistor 251, the voltage of the node (c) can be held for an extremely long time. Thus, the memory cell 250 can be used as a so-called nonvolatile storage device.

The read operation can be performed by input of power supply voltage from the power input terminal VDD. When the voltage of the node (c) is high-level voltage as described above, the transistor 255 is turned on and has much lower resistance than the resistor 257, so that ground voltage is output to the output terminal OUT. In contrast, when the voltage of the node (c) is low-level voltage, the transistor 255 is turned off and has much higher resistance than the resistor 257, so that power supply voltage is output to the output terminal OUT.

Here, by input of high-level voltage from the input terminal Sig5, the transistor 255 can be forcibly turned on regardless of voltage data retained in the node (c). Such operation is necessary for reading data from a given memory cell in the case where a plurality of memory cells are arranged in a column direction and the transistors 255 are connected in series as described later. For example, in the case where data is read from one memory cell, high-level voltage is input to the second electrodes of the capacitors 253 in the other memory cells connected in series with the one memory cell so that the transistors 255 are forcibly turned on; thus, the voltage data retained in the node (c) of the memory cell can be read selectively. Alternatively, in the case where a p-channel transistor is used as the transistor 255, by input of voltage which is lower than 0 V as the voltage input from the input terminal Sig5, the transistor 255 can be forcibly turned on.

Next, a method for refreshing data stored in the memory cell 250 is described.

By inputting a second input signal with amplitude voltage that is higher than 0 V to the control circuit 100 as in Embodiment 2, the threshold voltage of the transistor 251 is temporarily shifted negatively, so that the transistor 251 is temporarily set as a depletion transistor. Since the transistor 251 is temporarily a depletion transistor, by input of voltage input to Sig4 to the node (c), the data in the memory cell 250 can be refreshed without the use of an input signal from Sig3. This operation is particularly effective in the case where data stored in a plurality of memory cells is refreshed by one operation in a storage device including the plurality of memory cells to be described later.

<Application>

Next, an example in which a control circuit of the present invention is applied to a storage device including the plurality of memory cells 250 is described.

Figure 5B:
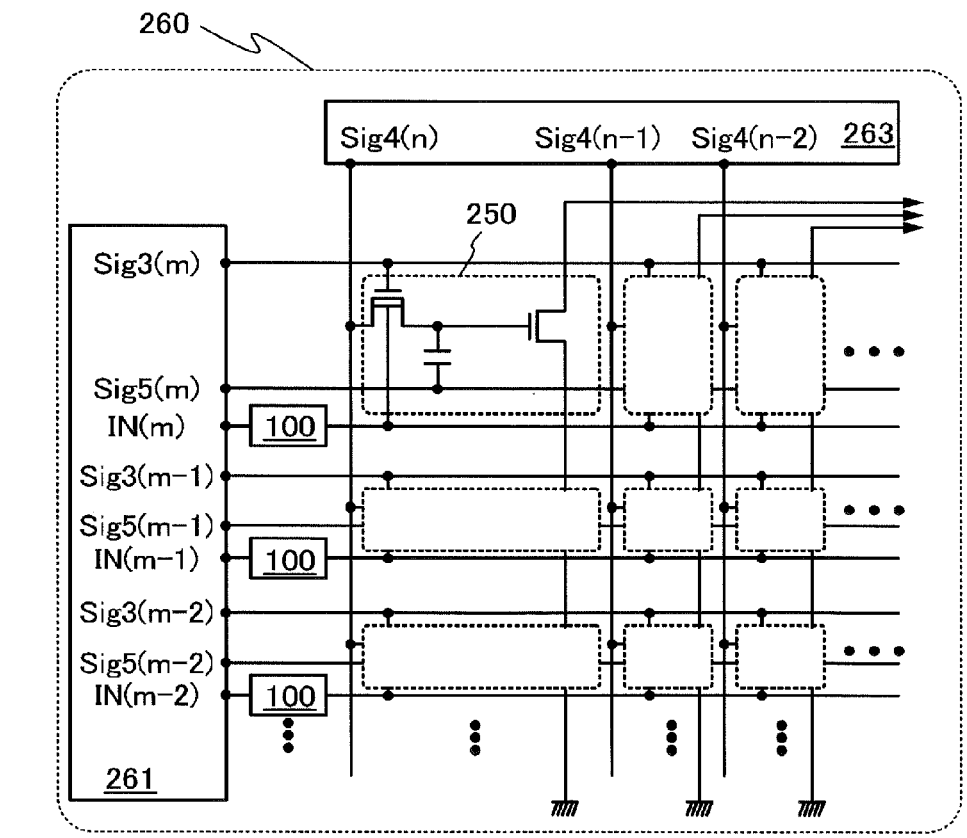

FIG. 5B illustrates a storage device 260 in which the plurality of memory cells 250 in FIG. 5A are arranged in matrix. The storage device 260 includes a first driver circuit 261, a second driver circuit 263, and the plurality of control circuits 100 in addition to the plurality of memory cells 250. In this embodiment, as in the storage device in Embodiment 2, the plurality of memory cells 250 are arranged in a matrix of m rows and n columns (m and n are each an integer of 1 or more), and one control circuit is provided per row (i.e., m control circuits 100 are provided in total).

The first driver circuit 261 includes m control lines Sig3(1) to Sig3(m) connected to the first gate electrodes of the transistors 251 in the memory cells 250 and m control lines Sig5(1) to Sig5(m) connected to the capacitors 253. On and off of the transistors in the memory cells arranged in rows and the voltage of the node (c) are controlled by the control lines Sig3(1) to Sig3(m) and the control lines Sig5(1) to Sig5(m). The first driver circuit 261 further includes m control lines IN(1) to IN(m) connected to the first to m-th control circuits, respectively. The m control lines IN(1) to IN(m) control signals input to the control circuits 100 connected to the m control lines IN(1) to IN(m).

The second driver circuit 263 includes n control lines Sig4(1) to Sig4(n) connected to the first electrodes of the transistors 251 in the memory cells 250. A signal of data input to the memory cells 250 arranged in columns is controlled by the control lines Sig4(1) to Sig4(n).

The transistors 255 in the memory cells arranged in a column are connected in series and are connected to one output signal line. Although not illustrated, the resistor 257, the power input terminal, and the like illustrated in FIG. 5A are provided at an end of each of the output signal lines. In the case where data in a given memory cell of the plurality of memory cells arranged in a column is read, the data stored in the given memory cell can be read when all the transistors 255 in the other memory cells from which data is not read are turned on by input signals from Sig5(1) to Sig5(m) as described above. Here, the resistor 257, the power input terminal, and the like for reading data may be incorporated in the second driver circuit 263.

As described in Embodiment 2, the control circuit 100 can control and hold the threshold voltages of the transistors 251 in n memory cells connected to the control circuit 100 at optimal levels in accordance with signals input from the first driver circuit 261 through the control line IN(m) and can temporarily change the threshold voltages so that the transistors 251 are set as depletion transistors. When the n transistors 251 connected to the control circuit 100 are temporarily changed into depletion transistors, the data stored in the memory cells can be refreshed at the same time by one signal.

Note that one or more control circuits 100 may be provided in the storage device 260 as described above.

Note that in this embodiment, the transistors 255 connected to each of the output signal lines are connected in series; however, selection transistors may be connected in series with the read transistors 255 in the memory cells so that data can be read selectively by turning on or off the selection transistors.

As described above, by application of a control circuit of the present invention to a storage device, it is possible to obtain a storage device including a plurality of memory cells that can hold threshold voltage at an optimal level and can easily perform refresh operation. Further, it is possible to obtain a nonvolatile storage device capable of retaining data even when supply of power is stopped.

This embodiment can be combined with any of the other embodiments disclosed in this specification as appropriate.

Embodiment 4

In this embodiment, a structure example where the semiconductor circuit capable of controlling the threshold voltage of a transistor in Embodiment 1 is used as a display device is described with reference to FIGS. 6A and 6B.

<Structure Example>

Figure 6A:
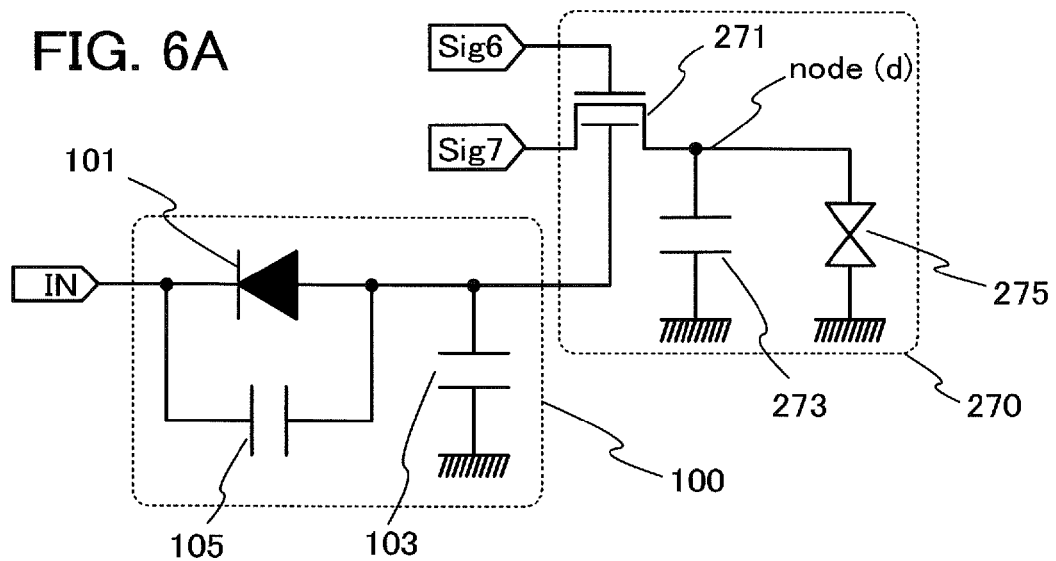
FIGS. 6A and 6B illustrate a display device in one embodiment of the present invention.

FIG. 6A illustrates a structure example of a pixel 270 applicable to a display device to which the control circuit 100 in Embodiment 1 is connected. The pixel 270 includes a transistor 271, a capacitor 273, and a display element 275. In this embodiment, an n-channel transistor is used as the transistor 271 as in the transistor 201 in Embodiment 2.

The structures and functions of the transistor 271 and the capacitor 273 are similar to the transistor and the capacitor in Embodiment 2; thus, detailed description thereof is omitted. Here, terminals connected to a first gate electrode and a first electrode of the transistor 271 are an input terminal Sig6 and an input terminal Sig7, respectively. Further, a node to which a second electrode of the transistor 271 and a first electrode of the capacitor 273 are connected is referred to as a node (d).

One electrode of the display element 275 is connected to the node (d), and the other electrode of the display element 275 is grounded. A dielectric element whose optical characteristics are changed when voltage is applied to its electrodes at opposite ends can be used as the display element 275. For example, a liquid crystal element or an element used for electronic paper or the like, such as an electrophoretic element or a twisting ball element, can be used. In this embodiment, the pixel can hold voltage in the node (d), so that the optical characteristics can be unchanged while the voltage is held in the node.

<Example of Circuit Operation>

Next, the circuit operation of the pixel 270 to which the control circuit 100 is connected is described.

First, as described in the above embodiment, a first input signal is input to the control circuit 100 so that the threshold voltage of the transistor 271 is adjusted to an optimal level, and the transistor 271 is controlled so as to function as an enhancement transistor.

As in the above embodiment, data is written to the pixel 270 by input of voltage to be held in the node (d) with input signals from the input terminal Sig6 and the input terminal Sig7. Here, high-level voltage or low-level voltage is held in the node (d).

Here, a transistor where an oxide semiconductor is used in a semiconductor layer in which a channel is formed and off-state current is extremely low as described in Embodiment 1 can be used as the transistor 271. With the use of such a transistor whose off-state current is extremely low as the transistor 271, the voltage of the node (d) can be held for an extremely long time. Thus, the optical characteristics of the display element 275 can be unchanged even when supply of power supply voltage is stopped. For example, even in the case where a liquid crystal element that cannot store data, such as a twisted nematic (TN) liquid crystal, is used, the element can be always kept in a state in which voltage is applied. Consequently, it is possible to exclude rewrite operation or it is possible to reduce the frequency of rewrite operation markedly.

Next, a method for refreshing voltage written to the pixel 270 is described.

By inputting a second input signal with amplitude voltage that is higher than 0 V (positive amplitude voltage) to the control circuit 100 as in the above embodiment, the threshold voltage of the transistor 271 is temporarily shifted negatively so that the transistor 271 is set as a depletion transistor. By input of voltage from Sig7 to the node (d) at this time, voltage in the pixel 270 (i.e., the optical characteristics of the display element 275) can be refreshed without the use of an input signal from Sig6. Such operation is particularly effective in the case where data stored in a plurality of pixels is refreshed by one operation in a display device including the plurality of pixels to be described later.
<Application>

Next, an example in which a control circuit of the present invention is applied to a display device including the plurality of pixels 270 is described.

Figure 6B:
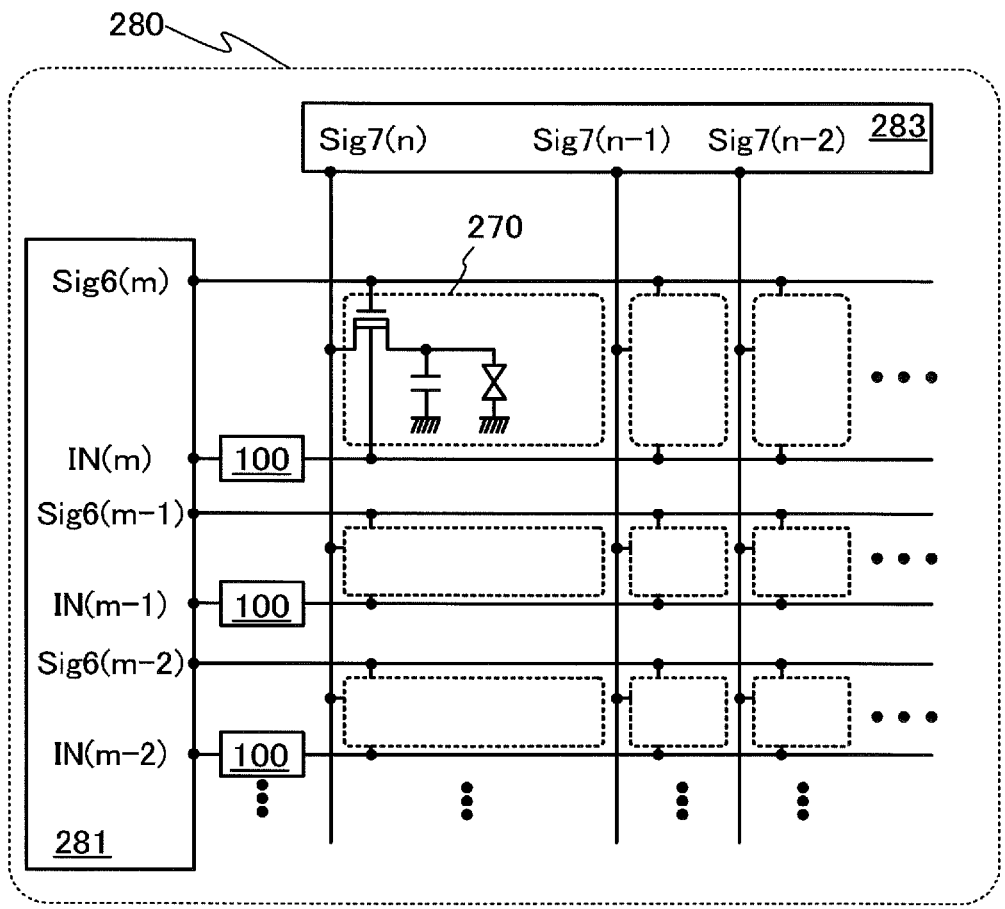

FIG. 6B illustrates a display device 280 in which the plurality of pixels 270 in FIG. 6A are arranged in matrix. The display device 280 includes a first driver circuit 281, a second driver circuit 283, and the plurality of control circuits 100 in addition to the plurality of pixels 270. In this embodiment, as in the storage device 210 in Embodiment 2, the plurality of pixels are arranged 270 in a matrix of m rows and n columns (m and n are each an integer of 1 or more), and m control circuits 100 are provided per row.

The first driver circuit 281 has a structure and a function which are similar to those of the first driver circuit 211 in Embodiment 2. Thus, the transistors 271 in the pixels 270 and the control circuits 100 are controlled by the first driver circuit 281 with the use of the control lines Sig6(1) to Sig6(*m*) and the control lines IN(1) to IN(m).

Similarly, the second driver circuit 283 has a structure and a function which are similar to those of the second driver circuit 213 in Embodiment 2. Thus, data input to the pixels through the transistors 271 is controlled by the second driver circuit 283 with the use of the control lines Sig7(1) to Sig7(*n*).

The optical characteristics of the display element in the pixel 270 are changed by voltage input to the node (d). For example, in the case where a liquid crystal display element is used, an image is displayed when the optical characteristics are changed so that light from a backlight is transmitted or blocked. Alternatively, in the case where an electrophoretic element is used, an image is displayed when the optical characteristics (reflectance and the like) with respect to light (external light) of the element are changed. Further, by a change in voltage input to the node (d), the pixel 270 can perform multilevel gradation display.

As described in the above embodiment, the control circuit 100 can control and hold the threshold voltages of the transistors 271 in the n pixels 270 connected to the control circuit 100 at optimal levels in accordance with input signals from the first driver circuit 281 and can temporarily change the threshold voltages so that the transistors 271 are set as depletion transistors. When the n transistors connected to the control circuit 100 are temporarily changed into depletion transistors, voltage (i.e., display images) stored in the pixels can be refreshed at the same time by one signal.

Note that one or more control circuits 100 may be provided in the display device 280 as described above.

As described above, by application of a control circuit of the present invention to a display device, it is possible to obtain a display device including a plurality of pixels that can hold threshold voltage at an optimal level and can easily perform refresh operation. Further, it is possible to obtain a display device capable of holding a display image even when supply of power is stopped.

This embodiment can be combined with any of the other embodiments disclosed in this specification as appropriate.

Embodiment 5

In this embodiment, examples of structures and methods for forming a transistor including an oxide semiconductor in a semiconductor layer in which a channel is formed that is applicable to the above embodiment, a transistor applicable to a peripheral circuit, and a capacitor are described with reference to FIGS. 7A to 7D.
<Structure Example>

Figure 7A:
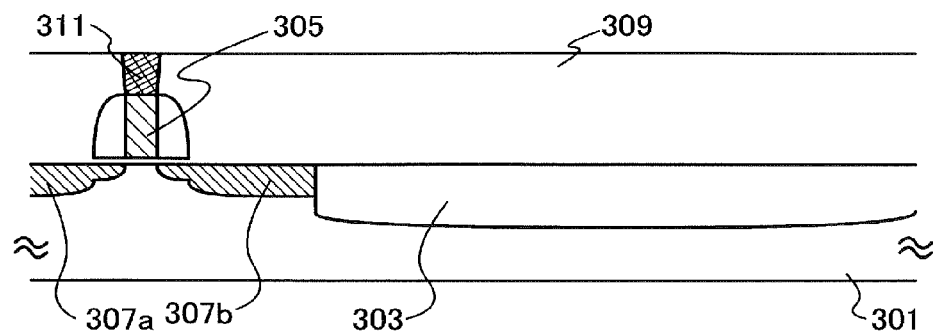
FIGS. 7A to 7D illustrate steps of forming a transistor in one embodiment of the present invention.
Figure 7B:
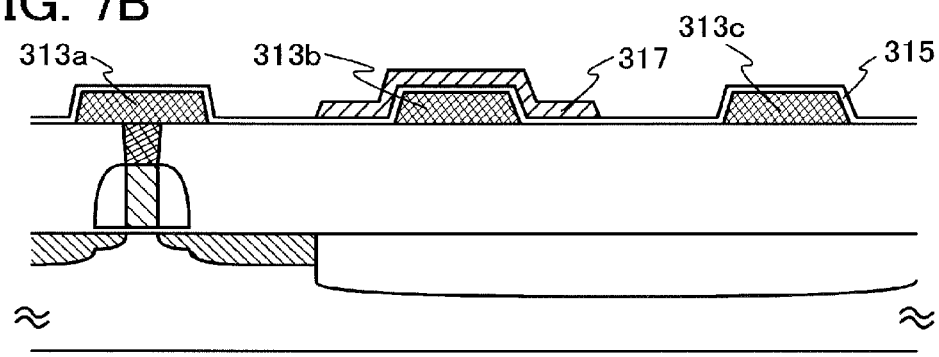
Figure 7C:
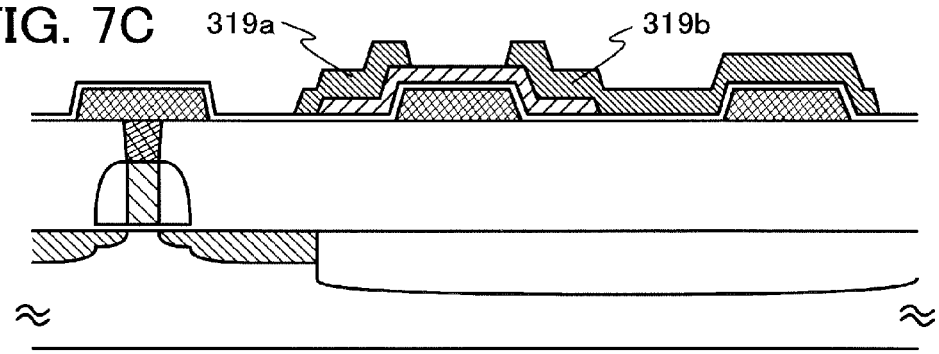
Figure 7D:
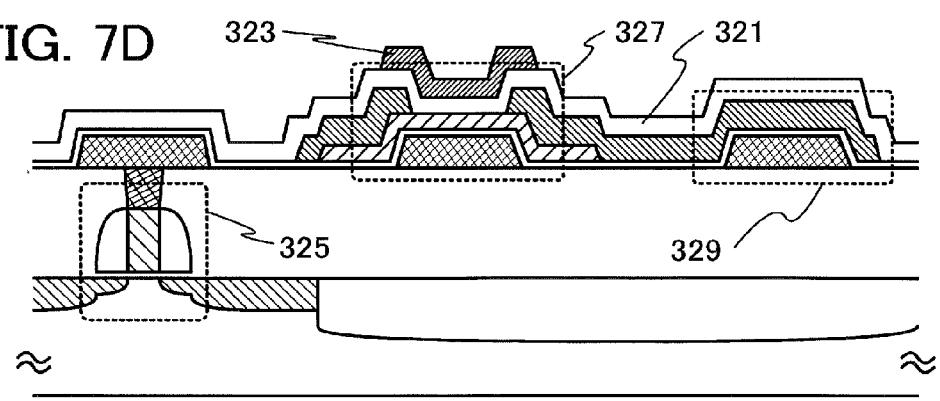

FIG. 7D is a cross-sectional schematic diagram illustrating a structure where a transistor 325, a transistor 327, and a capacitor 329 are formed on a single crystal semiconductor substrate 301.

The transistor 325 includes a single crystal semiconductor in a semiconductor layer in which a channel is formed and can be used as the transistor in the control circuit 100 described in the above embodiment (except as the diode in the control circuit 100). In this embodiment, a single crystal semiconductor is used for the transistor 325; however, a thin film transistor formed over an insulating substrate of glass or the like can be used. In the case where the transistor 325 is used in the display device in Embodiment 4, the transistor 325 is preferably formed over a light-transmitting insulating substrate.

The transistor 327 includes an oxide semiconductor in a semiconductor layer in which a channel is formed, and has two gate electrodes facing each other with the semiconductor layer provided therebetween. The transistor 327 can be used as the diode in the control circuit 100 described in the above embodiment. The transistor 327 can also be used as a transistor to which the control circuit 100 is connected.

An oxide semiconductor used for a semiconductor layer in this embodiment is an i-type (intrinsic) oxide semiconductor or a substantially i-type (intrinsic) oxide semiconductor. The intrinsic oxide semiconductor or substantially intrinsic oxide semiconductor is obtained in such a manner that hydrogen, which functions as an n-type impurity, is removed, and the oxide semiconductor is highly purified to contain as few impurities as possible.

Note that the highly purified oxide semiconductor includes extremely few carriers, and the carrier concentration is controlled to be lower than $1\times10^{14}/cm^3$, preferably lower than $1\times10^{12}/cm^3$, more preferably lower than $1\times10^{11}/cm^3$. Such few carriers make current in an off state (off-state current) sufficiently low.

Specifically, in the transistor including the oxide semiconductor layer, leakage current density (off-state current density) per micrometer of channel width between a source and a drain in an off state can be 100 zA/μm ($1\times10^{-19}$ A/μm) or lower, 10 zA/μm ($1\times10^{-20}$ A/μm) or lower, or 1 zA/μm ($1\times10^{-21}$ A/μm) or lower with a source-drain voltage of 3.5 V at operating temperature (e.g., 25° C.).

The transistor including the highly purified oxide semiconductor layer hardly has temperature dependence of on-state current, and the off-state current remains extremely low at a high temperature.

The capacitor 329 can be used as the capacitor in the control circuit 100 or a different circuit described in the above embodiment. In this embodiment, the capacitor 329 is formed using a first wiring, a gate insulating layer, and a second wiring that are used for the transistor 327; however, this embodiment is not limited to this structure. The capacitor 329 may be formed using the second wiring, a second interlayer insulating layer, and a third wiring or may be formed using an impurity region formed in the single crystal semiconductor substrate, a first interlayer insulating layer, and the first wiring.

In this embodiment, the transistor 327 and the capacitor 329 are assumed to be the transistor used as the diode and the capacitor in the control circuit 100, respectively, and the second wiring connected to a source or a drain of the transistor 327 and an upper electrode of the capacitor 329 correspond to a sequence of films. Note that other transistors can be connected to each other or a different transistor and a different capacitor can be connected to each other as appropriate depending on a circuit structure with the use of the first wiring, the second wiring, the third wiring, or a contact plug formed in the interlayer insulating layer for separating these wirings.

<Example of Manufacturing Step>

Next, examples of manufacturing steps are sequentially described with reference to FIGS. 7A to 7D. First, by a known semiconductor processing technique, an element isolation layer 303 is formed on one surface of the substrate 301 of a single crystal semiconductor such as silicon or gallium arsenide, and impurity regions 307a and 307b and a gate 305 of the transistor 325 are formed. In addition, a first interlayer insulating layer 309 is formed and a first contact plug 311 is formed (see FIG. 7A). Here, a silicide layer or the like may be provided on surfaces of the impurity regions 307a and 307b so that conductivity is increased. Further, a contact plug (not illustrated) reaching the impurity region is formed as appropriate at the time of formation of the contact plug 311.

Then, first wirings 313a to 313c are formed. Here, the first wiring 313b functions as a first gate electrode of the transistor 327, and the first wiring 313c functions as a lower electrode of the capacitor 329. A conductive material that can withstand the temperature of heat treatment to be performed in a later step can be used as the material of the first wiring. For example, the first wiring can be formed to have a single-layer structure or a layered structure using a metal such as Mo, Ti, Cr, Ta, W, Nd or Sc, and/or an alloy or a conductive oxide containing the above metal as its main component. Note that Al or Cu can be used as the metal material if it can withstand the temperature of heat treatment to be performed in a later step. In the case where aluminum or copper is used for the first wiring, aluminum or copper is preferably used in combination with a refractory material in order to avoid problems of heat resistance and corrosion. In the case where Cu is used for the first wiring, it is preferable that a Cu—Mg—Al alloy be used for a base layer and that Cu be used for a layer over the base layer because adhesion between a base film (e.g., an oxide film) and Cu is increased.

Alternatively, a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added, can be used for the first wiring. Alternatively, the first wiring can have a layered structure using the light-transmitting conductive material and the metal element.

In a portion that serves as the first gate electrode of the transistor 327, a material layer that is in contact with the gate insulating layer may be provided between the gate electrode and the gate insulating layer. As the material layer that is in contact with the gate insulating layer, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride film (e.g., InN or ZnN) can be used. It is preferable that the film have a work function of 5 eV or higher, preferably 5.5 eV or higher because the threshold voltage of the transistor 327 can be increased. For example, in the case where an In—Ga—Zn—O film containing nitrogen is used, an In—Ga—Zn—O film in which the nitrogen concentration higher than the nitrogen concentration of the oxide semiconductor layer, specifically an In—Ga—Zn—O film in which the nitrogen concentration is higher than or equal to 7 at. % is used.

Then, a gate insulating layer 315 for covering the first wirings 313a to 313c and the first interlayer insulating layer 309 is formed. The gate insulating layer 315 can be a single layer or a stacked layer of silicon oxide, silicon oxynitride, aluminum oxide, aluminum nitride, hafnium oxide, tantalum oxide, gallium oxide, zirconium oxide, or the like. The thickness of the gate insulating layer 315 is preferably 6 to 200 nm.

Next, an oxide semiconductor layer 317 is formed (see FIG. 7B). An oxide semiconductor in which indium accounts for 20 at. % or more of all the metal elements is preferably used as the oxide semiconductor. At the time of formation, attention needs to be paid to prevent mixing of hydrogen, and the oxide semiconductor is preferably deposited by sputtering with hydrogen and water in an atmosphere, in a target, and on surfaces of the target and a device sufficiently reduced. After the oxide semiconductor is deposited, heat treatment may be performed in an atmosphere from which water and hydrogen are reduced so that water and hydrogen in the film are eliminated.

As the oxide semiconductor layer, an oxide semiconductor layer having a crystal region which is c-axis-aligned perpendicularly to a surface of the film may be formed by performing deposition twice and heat treatment twice, regardless of the material of a base member, such as an oxide, a nitride, or a metal. For example, after a first oxide semiconductor layer with a thickness of 3 to 15 nm is deposited, first heat treatment is performed at 450 to 850° C., preferably 550 to 750° C. in the atmosphere of nitrogen, oxygen, a rare gas, or dry air, so that a first oxide semiconductor layer which includes a crystalline region (including plate-like crystals) in a region including its surface is formed. Then, after a second oxide semiconductor layer which has a larger thickness than the first oxide semiconductor layer is formed, second heat treatment is performed at 450 to 850° C., preferably 600 to 700° C., so that crystal growth proceeds upward with the use of the first oxide semiconductor layer as a seed of the crystal growth and the entire second oxide semiconductor layer is crystallized. In such a manner, the oxide semiconductor layer having a thick crystal region may be formed. Note that in that case, a material that can withstand the temperature of heat treatment is used as the material of a contact plug and a wiring.

Further, an oxide semiconductor layer having a crystal region which is c-axis-aligned perpendicularly to a surface of the film may be formed by deposition of an oxide semiconductor layer while the substrate is heated to a temperature at which the oxide semiconductor is c-axis aligned. With such deposition, the number of processes can be reduced. The temperature for heating the substrate may be set as appropriate in accordance with other deposition conditions which differ depending on a deposition apparatus. For example, when the deposition is performed with a sputtering apparatus, the substrate temperature may be 250° C. or higher.

The oxide semiconductor layer in this embodiment is non-single-crystal and the oxide semiconductor layer is not entirely in an amorphous state. Since the oxide semiconductor layer is not entirely in an amorphous state, formation of an amorphous portion whose electrical characteristics are unstable is suppressed.

Then, second wirings 319a and 319b are formed (see FIG. 7C). For example, the second wiring can be a single layer or a stacked layer of a metal film containing an element selected from Al, Cr, Cu, Ta, Ti, Mo, or W; an alloy containing any of these elements as its component; a metal nitride film containing any of these elements as its component (e.g., a titanium nitride film, a molybdenum nitride film, or a tungsten nitride film); or the like. In addition, in order to solve problems caused by poor heat-resistivity and high corrosiveness, a film of a refractory metal such as Ti, Mo, W, Cr, Ta, Nd, Sc, or Y or a metal nitride film thereof (e.g., a titanium nitride film, a molybdenum nitride film, or a tungsten nitride film) may be stacked on one or both of a lower side and an upper side of a metal film of Al, Cu, or the like. Alternatively, the second wiring may be formed using a conductive metal oxide. As the conductive metal oxide, indium oxide, tin oxide, zinc oxide, a mixed oxide of indium oxide and tin oxide, a mixed oxide of indium oxide and zinc oxide, or the metal oxide material containing silicon or silicon oxide can be used. Note that lower portions of the second wirings 319a and 319b are in direct contact with the oxide semiconductor 317; thus, the second wirings 319a and 319b are preferably formed using a material suitable for the purpose.

Next, a second interlayer insulating layer 321 is formed. Since the second interlayer insulating layer 321 is in contact with a top surface of the oxide semiconductor layer 317, an insulating film used for the second interlayer insulating layer 321 preferably contains as few impurities (e.g., moisture and hydrogen) as possible and may be formed using a single layer of an insulating film or a stacked layer of a plurality of insulating films. For example, an insulating film having a high barrier property, such as a silicon nitride film, a silicon nitride oxide film, an aluminum nitride film, an aluminum nitride oxide film, an aluminum oxide film, or a gallium oxide film, can be used.

Finally, a third wiring 323 is formed over the second interlayer insulating layer 321 (see FIG. 7D). The third wiring 323 can be formed using any of the materials given as examples of the material of the first wiring or the second wiring as appropriate.

In this embodiment, the transistor 327 includes the back gate; however, when the transistor 327 is used as the diode in the control circuit 100, the transistor 327 does not necessarily include the back gate.

In this manner, the transistor 325, the transistor 327, and the capacitor 329 are formed.

The transistor 327 formed in this manner can have extremely low leakage current in an off state. By application of such a transistor to the diode in the control circuit or the transistor in the storage device or the display device described in the above embodiment, the voltage of a node connected to the transistor can be held for an extremely long time.

Embodiment 6

In this embodiment, applications of a semiconductor device including the semiconductor circuit capable of controlling the threshold voltage of a transistor described in the above embodiment to an electronic device are described with reference to FIGS. 8A to 8F. In this embodiment, applications of the semiconductor device to an electronic device such as a computer, a cellular phone set (also referred to as a cellular phone or a cellular phone device), a personal digital assistant (including a portable game machine, an audio reproducing device, and the like), a camera such as a digital camera or a digital video camera, electronic paper, or a television set (also referred to as a television or a television receiver) are described.

Figure 8A:
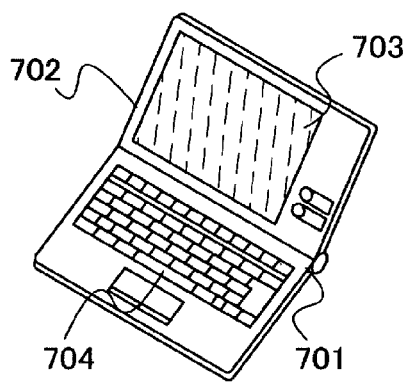
FIGS. 8A to 8F illustrate electronic devices in one embodiment of the present invention.

FIG. 8A is a laptop, which includes a housing 701, a housing 702, a display portion 703, a keyboard 704, and the like. The semiconductor device described in the above embodiment is provided in at least one of the housing 701, the housing 702, and the display portion 703. Thus, a laptop in which power consumption is sufficiently reduced by retaining data in a circuit or a display image even when supply of power supply voltage is stopped and reset or refresh operation can be performed easily is obtained.

Figure 8D:
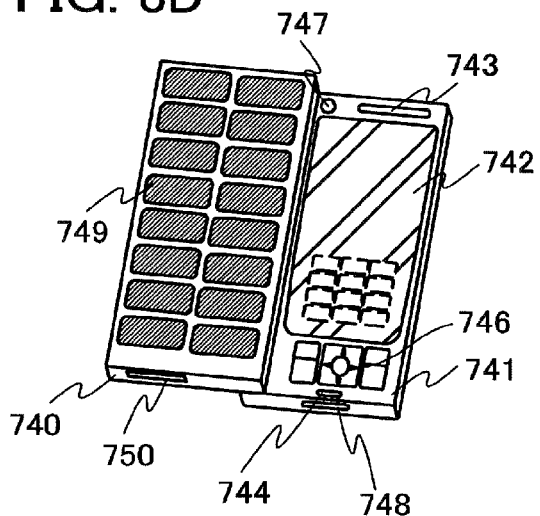
Figure 8B:
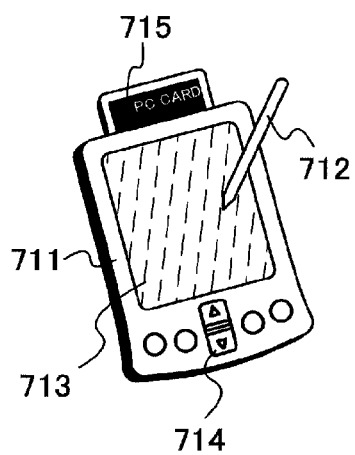

FIG. 8B is a personal digital assistant (PDA). A main body 711 is provided with a display portion 713, an external interface 715, operation buttons 714, and the like. Further, a stylus 712 and the like for operation of the personal digital assistant are provided. The semiconductor device described in the above embodiment is provided in at least one of the main body 711 and the display portion 713. Thus, a personal digital assistant in which power consumption is sufficiently reduced by retaining data in a circuit or a display image even when supply of power supply voltage is stopped and reset or refresh operation can be performed easily is obtained.

Figure 8E:
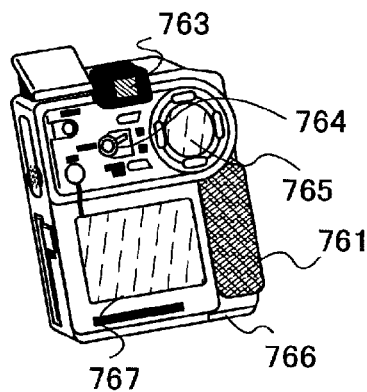
Figure 8C:
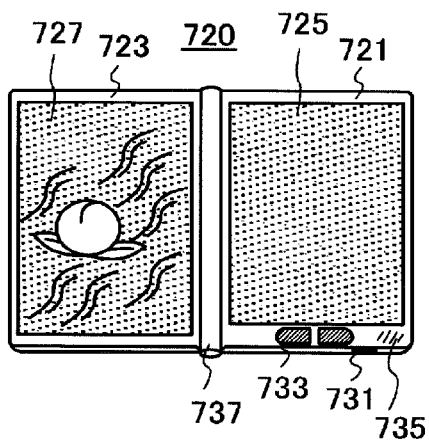

FIG. 8C is an e-book reader 720 provided with electronic paper. The e-book reader 720 has two housings 721 and 723. The housing 721 and the housing 723 include a display portion 725 and a display portion 727, respectively. The housings 721 and 723 are connected to each other by a hinge 737 and can be opened and closed with the hinge 737 used as an axis. The housing 721 is provided with a power switch 731, operation keys 733, a speaker 735, and the like. The semiconductor device described in the above embodiment is provided in at least one of the housing 721, the housing 723, the display portion 725, and the display portion 727. Thus, an e-book reader in which power consumption is sufficiently reduced by retaining data in a circuit or a display image even when supply of power supply voltage is stopped and reset or refresh operation can be performed easily is obtained.

FIG. 8D is a cellular phone set, which includes two housings 740 and 741. Further, the housing 740 and the housing 741 which are developed as illustrated in FIG. 8D can overlap with each other by sliding; thus, the size of the cellular phone set can be decreased, which makes the cellular phone set suitable for being carried. The housing 741 includes a display panel 742, a speaker 743, a microphone 744, a pointing device 746, a camera lens 747, an external connection terminal 748, and the like. The housing 740 includes a solar cell 749 for storing electricity in the cellular phone set, an external memory slot 750, and the like. In addition, an antenna is incorporated in the housing 741. The semiconductor device described in the above embodiment is provided in at least one of the housing 740, the housing 741, and the display panel 742. Thus, a cellular phone set in which power consumption is sufficiently reduced by retaining data in a circuit or a display image even when supply of power supply voltage is stopped and reset or refresh operation can be performed easily is obtained.

FIG. 8E is a digital camera, which includes a main body 761, a display portion 767, an eyepiece 763, an operation switch 764, a display portion 765, a battery 766, and the like. The semiconductor device described in the above embodiment is provided in at least one of the main body 761, the display portion 765, and the display portion 767. Thus, a digital camera in which power consumption is sufficiently reduced by retaining data in a circuit or a display image even when supply of power supply voltage is stopped and reset or refresh operation can be performed easily is obtained.

Figure 8F:
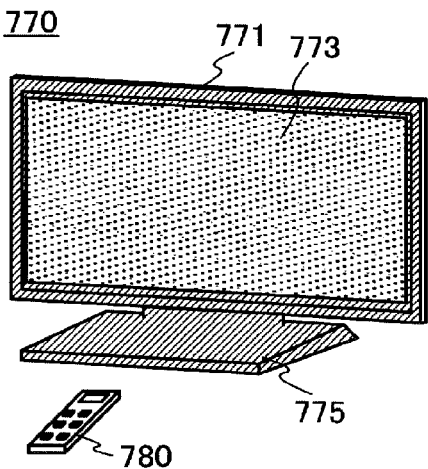

FIG. 8F is a television set 770, which includes a housing 771, a display portion 773, a stand 775, and the like. The television set 770 can be operated with an operation switch of the housing 771 or a remote control 780. The semiconductor device described in the above embodiment is mounted on at least one of the housing 771, the remote control 780, and the display portion 773. Thus, a television set in which power consumption is sufficiently reduced by retaining data in a circuit or a display image even when supply of power supply voltage is stopped and reset or refresh operation can be performed easily is obtained.

As described above, the electronic devices described in this embodiment each include the semiconductor device described in the above embodiment. Thus, an electronic device in which power consumption is sufficiently reduced by retaining data in a circuit or a display image even when supply of power supply voltage is stopped and reset or refresh operation can be performed easily is obtained.

This application is based on Japanese Patent Application serial No. 2010-287598 filed with Japan Patent Office on Dec. 24, 2010, the entire contents of which are hereby incorporated by reference.

What is claimed is:

1. A circuit comprising:
a diode comprising a first electrode and a second electrode;
a first capacitor electrically connected to the first electrode of the diode;
a second capacitor comprising a first electrode and a second electrode; and
a transistor comprising a back gate electrically connected to the first electrode of the diode,
wherein the first electrode of the diode is directly connected to the first electrode of the second capacitor, and
wherein the second electrode of the diode is directly connected to the second electrode of the second capacitor.

2. The circuit according to claim 1, wherein the transistor comprises an oxide semiconductor in a channel.

3. An electronic device comprising the circuit according to claim 1.

4. A circuit comprising:
a control circuit comprising:
a diode;
a first capacitor electrically connected to the diode; and
a second capacitor electrically connected in parallel to the diode, the second capacitor comprising a first electrode and a second electrode; and
a register circuit comprising:
a first transistor comprising a first electrode, a second electrode, a gate, and a back gate;
a third capacitor electrically connected to the second electrode of the first transistor; and
a flip-flop circuit electrically connected to the second electrode of the first transistor,
wherein the diode is electrically connected to the back gate of the first transistor.

5. The circuit according to claim 4, wherein the first transistor comprises an oxide semiconductor in a channel.

6. The circuit according to claim 4,
wherein the diode is a second transistor comprising a first electrode, a second electrode, and a gate,
wherein the first electrode of the second transistor is electrically connected to the first electrode of the second capacitor, and
wherein the second electrode of the second transistor is electrically connected to the gate of the second transistor, the back gate of the first transistor, and the second electrode of the second capacitor.

7. The circuit according to claim 6,
wherein the second transistor further comprises a back gate, and
wherein the back gate of the second transistor is electrically connected to the second electrode of the second transistor.

8. The circuit according to claim 6, wherein the second transistor comprises an oxide semiconductor in a channel.

9. An electronic device comprising the circuit according to claim 4.

10. A circuit comprising:
a control circuit comprising:
a diode;
a first capacitor electrically connected to the diode; and
a second capacitor electrically connected in parallel to the diode, the second capacitor comprising a first electrode and a second electrode; and
a memory cell comprising:
a first transistor comprising a first electrode, a second electrode, a gate, and a back gate;
a second transistor comprising a gate which is electrically connected to the second electrode of the first transistor; and
a third capacitor electrically connected to the second electrode of the first transistor;
wherein the diode is electrically connected to the back gate of the first transistor.

11. The circuit according to claim 10, wherein the first transistor comprises an oxide semiconductor in a channel.

12. The circuit according to claim 10,
wherein the diode is a third transistor comprising a first electrode, a second electrode, and a gate,
wherein the first electrode of the third transistor is electrically connected to the first electrode of the second capacitor, and wherein the second electrode of the third transistor is electrically connected to the gate of the third transistor, the back gate of the first transistor, and the second electrode of the second capacitor.

13. The circuit according to claim 12,
wherein the third transistor further comprises a back gate, and
wherein the back gate of the third transistor is electrically connected to the second electrode of the third transistor.

14. The circuit according to claim 12, wherein the third transistor comprises an oxide semiconductor in a channel.

15. An electronic device comprising the circuit according to claim 10.

* * * * *